US012804832B2

(12) United States Patent
Ebine et al.

(10) Patent No.: US 12,804,832 B2
(45) Date of Patent: Nov. 17, 2026

(54) ELECTRONIC DEVICE

(71) Applicant: Yokogawa Electric Corporation, Musashino (JP)

(72) Inventors: Ryo Ebine, Musashino (JP); Taihei Hamada, Musashino (JP)

(73) Assignee: Yokogawa Electric Corporation, Musashino (JP)

( * ) Notice: Subject to any disclaimer, the term of this patent is extended or adjusted under 35 U.S.C. 154(b) by 246 days.

(21) Appl. No.: 18/627,647

(22) Filed: Apr. 5, 2024

(65) Prior Publication Data

US 2024/0407117 A1 Dec. 5, 2024

(30) Foreign Application Priority Data

May 29, 2023 (JP) ................................ 2023-088093

(51) Int. Cl.
*H05K 5/02* (2006.01)
*H05K 5/03* (2006.01)

(52) U.S. Cl.
CPC ............ *H05K 5/0247* (2013.01); *H05K 5/03* (2013.01)

(58) Field of Classification Search
CPC ...... H05K 5/0217; H05K 5/03; H05K 5/0247; H01R 31/06
See application file for complete search history.

(56) References Cited

U.S. PATENT DOCUMENTS 6,366,436 B1 * 4/2002 Maier ..................... G01F 15/06 73/35.14
6,898,980 B2 * 5/2005 Behm ................... G01L 19/083 73/756

(Continued)

FOREIGN PATENT DOCUMENTS

CN 208623532 U 3/2019
JP 53-31449 U 8/1976

(Continued)

OTHER PUBLICATIONS

Extended Supplementary European Search Report dated Oct. 2, 2024, issued in counterpart Application No. 24169243.3. (7 pages).

(Continued)

*Primary Examiner* — Jayprakash N Gandhi
*Assistant Examiner* — Matthew Sinclair Muir
(74) *Attorney, Agent, or Firm* — WHDA, LLP

(57) ABSTRACT

An electronic device includes a container, a partition wall dividing a space within the container, a through-hole provided in the partition wall, an electrical connection component attached to the partition wall so as to be removable from the container and having an insertion portion inserted into the through-hole, a first electronic component attachable to the electrical connection component on one side of the partition wall so as to be removable from the container, and a second electronic component attachable to the electrical connection component on another side of the partition wall so as to be removable from the container. The first electronic component and the second electronic component can be electrically connected to each other via the electrical connection component by each being attached to the electrical connection component.

10 Claims, 1 Drawing Sheet

(56) References Cited

U.S. PATENT DOCUMENTS

| | | | | |
|---|---|---|---|---|
| 8,031,453 | B2 * | 10/2011 | Nelson | H05K 7/1462 361/92 |
| 8,223,478 | B2 * | 7/2012 | Perrault | H05K 7/1462 439/246 |
| 8,852,775 | B2 * | 10/2014 | McGuire | H01M 50/574 429/96 |
| 2006/0032653 | A1 | 2/2006 | Minoshima et al. | |
| 2015/0289357 | A1 | 10/2015 | Wakana et al. | |
| 2016/0105123 | A1 | 4/2016 | Aoki | |
| 2019/0011295 | A1 * | 1/2019 | Erkelenz | G01D 21/00 |
| 2019/0063964 | A1 * | 2/2019 | Wolff | G01D 5/245 |
| 2020/0052472 | A1 | 2/2020 | Goto et al. | |
| 2021/0021747 | A1 * | 1/2021 | Brzobohaty | H04N 23/54 |
| 2022/0256723 | A1 * | 8/2022 | Beissert | H05K 7/1462 |

FOREIGN PATENT DOCUMENTS

| | | | |
|---|---|---|---|
| JP | S59-77275 | U | 5/1984 |
| JP | S61-146980 | U | 9/1986 |
| JP | 2012-141165 | A | 7/2012 |
| JP | 2016-040815 | A | 3/2016 |
| JP | 2020-025025 | A | 2/2020 |

OTHER PUBLICATIONS

Office Action dated Feb. 3, 2026, issued in counterpart JP Application No. 2023-088093, with English translation. (10 pages).

* cited by examiner

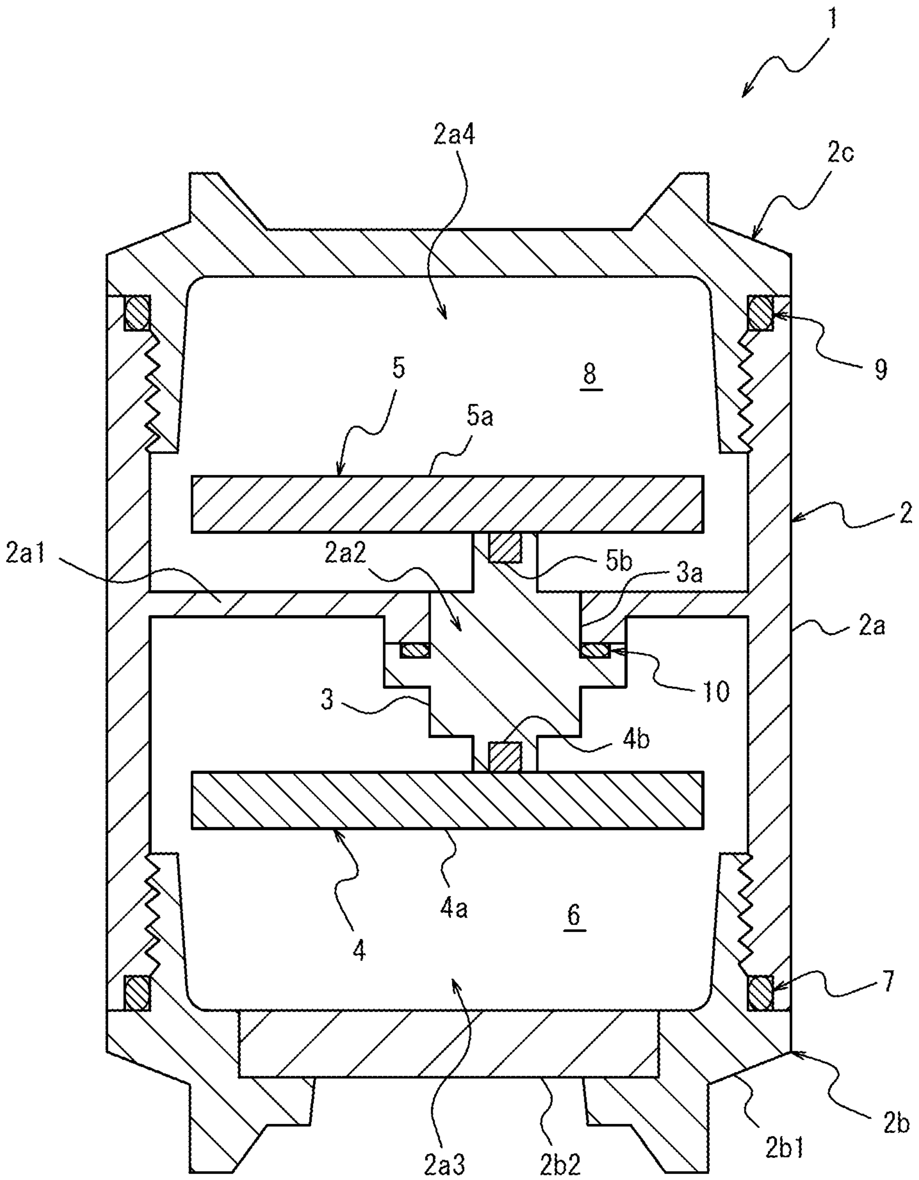
1
2a4
2c
9
5
8
5a
2
2a1
2a2
5b
3a
2a
10
3
4b
4a
4
6
7
2b
2a3
2b2
2b1

ELECTRONIC DEVICE

CROSS-REFERENCE TO RELATED APPLICATION

The present application claims priority to and the benefit of Japanese Patent Application No. 2023-088093 filed May 29, 2023, the entire contents of which are incorporated herein by reference.

TECHNICAL FIELD

The present disclosure relates to an electronic device.

BACKGROUND

A known electronic device includes a container, a partition wall dividing a space within the container, a through-hole provided in the partition wall, an electrical connection component attached to the partition wall and having an insertion portion inserted into the through-hole, a first electronic component attached to the electrical connection component on one side of the partition wall, and a second electronic component attached to the electrical connection component on the other side of the partition wall, wherein the first electronic component and the second electronic component can be electrically connected to each other via the electrical connection component by each being attached to the electrical connection component. See, for example, Patent Literature (PTL) 1.

CITATION LIST

Patent Literature

PTL 1: JP S53-031449 U

SUMMARY

An electronic device including:

a container;

a partition wall dividing a space within the container;

a through-hole provided in the partition wall;

an electrical connection component attached to the partition wall so as to be removable from the container and having an insertion portion inserted into the through-hole;

a first electronic component attachable to the electrical connection component on one side of the partition wall so as to be removable from the container; and a second electronic component attachable to the electrical connection component on another side of the partition wall so as to be removable from the container, wherein the first electronic component and the second electronic component can be electrically connected to each other via the electrical connection component by each being attached to the electrical connection component.

BRIEF DESCRIPTION OF THE DRAWINGS

In the accompanying drawings:

FIG. 1 is a cross-sectional diagram illustrating an electronic device in an embodiment of the present disclosure.

DETAILED DESCRIPTION

An electronic device such as the one described above preferably allows the electrical connection component, the first electronic component, and the second electronic component to be removed separately from the container during disposal, maintenance, or the like.

It would be helpful to provide an electronic device such that an electrical connection component, a first electronic component, and a second electronic component can be separately removed from a container.

Aspects of the present disclosure are as follows.

[1] An electronic device including:

a container;

a partition wall dividing a space within the container;

a through-hole provided in the partition wall;

an electrical connection component attached to the partition wall so as to be removable from the container and having an insertion portion inserted into the through-hole;

a first electronic component attachable to the electrical connection component on one side of the partition wall so as to be removable from the container; and a second electronic component attachable to the electrical connection component on another side of the partition wall so as to be removable from the container, wherein the first electronic component and the second electronic component can be electrically connected to each other via the electrical connection component by each being attached to the electrical connection component.

[2] The electronic device recited in [1], wherein the container includes a container body forming a first opening through which the first electronic component can pass at the one side of the partition wall, and a first lid capable of opening the first opening.

[3] The electronic device recited in [2], wherein the first opening is configured to allow the electrical connection component to pass through the first opening.

[4] The electronic device recited in [2] or [3], wherein the container body forms a second opening through which the second electronic component can pass at the other side of the partition wall, and the container includes a second lid capable of opening the second opening.

[5] The electronic device recited in any one of [1] to [4], wherein one of the first electronic component and the second electronic component is an amplifier component and the other of the first electronic component and the second electronic component is a terminal component.

[6] The electronic device recited in any one of [1] to [5], wherein the first electronic component includes a substrate and a first connector mounted on the substrate, and the first electronic component is fixed to the partition wall by being attached to the electrical connection component via the first connector.

[7] The electronic device recited in any one of [1] to [6], wherein the second electronic component includes a substrate and a second connector mounted on the substrate, and the second electronic component is fixed to the partition wall by being attached to the electrical connection component via the second connector.

[8] The electronic device recited in any one of [1] to [7], further including a partition wall sealing member surrounding the insertion portion of the electrical connection component so as to seal a gap between the partition wall and the electrical connection component.

[9] The electronic device recited in any one of [1] to [8], wherein the container includes a container body forming a first opening through which the first electronic component can pass at the one side of the partition wall and a second opening through which the second electronic component can pass at the other side of the partition wall, a first lid capable of opening the first opening, and a second lid capable of opening the second opening, the container body includes the partition wall, and the container body, the first lid, the second lid, and the electrical connection component form an explosion-proof structure.

[10] The electronic device recited in any one of [1] to [9], wherein the electronic device is configured as a field device.

According to the present disclosure, an electronic device such that an electrical connection component, a first electronic component, and a second electronic component can be separately removed from a container can be provided.

Embodiments of the present disclosure are illustrated below with reference to the drawings.

As illustrated in FIG. 1, in an embodiment of the present disclosure, an electronic device 1 includes a container 2, a partition wall 2*al* dividing a space within the container 2, a through-hole 2*a*2 provided in the partition wall 2*al*, an electrical connection component 3 attached to the partition wall 2*al* so as to be removable from the container 2 and having an insertion portion 3*a* inserted into the through-hole 2*a*2, a first electronic component 4 attachable to the electrical connection component 3 on one side of the partition wall 2*al* so as to be removable from the container 2, and a second electronic component 5 attachable to the electrical connection component 3 on another side of the partition wall 2*al* so as to be removable from the container 2. The first electronic component 4 and the second electronic component 5 can be electrically connected to each other via the electrical connection component 3 by each being attached to the electrical connection component 3.

According to the above configuration, the first electronic component 4 can be detached from the electrical connection component 3 on one side of the partition wall 2*al* and removed from the container 2, the second electronic component 5 can be detached from the electrical connection component 3 on the other side of the partition wall 2*al* and removed from the container 2, and the electrical connection component 3 attached to the partition wall 2*al* can be removed from the container 2. The electrical connection component 3, the first electronic component 4, and the second electronic component 5 can therefore be separately removed from the container 2. As a result, the container 2, the electrical connection component 3, the first electronic component 4, and the second electronic component 5 can be sorted by material at the time of disposal, for example, and in a case in which the first electronic component 4 and the second electronic component 5 are of different materials, the first electronic component 4 and the second electronic component 5 can be sorted. Furthermore, the electrical connection component 3, the first electronic component 4, or the second electronic component 5 can, for example, be individually removed from the container 2 for repair or replacement as necessary during periodic maintenance, repair, or the like.

The electrical connection component 3 enables power supply, analog or digital communication, or any combination thereof, for example, between the first electronic component 4 and the second electronic component 5 via the electrical connection between the first electronic component 4 and the second electronic component 5.

The container 2 includes a container body 2*a*, made of metal or the like, forming a first opening 2*a*3 through which the first electronic component 4 can pass at the one side of the partition wall 2*a*1, and a first lid 2*b* capable of opening the first opening 2*a*3. According to this configuration, a closed first chamber 6 can be formed on one side of the partition wall 2*al* by closing the first opening 2*a*3 of the container body 2*a* with the first lid 2*b*, and the first chamber 6 can be opened by the first lid 2*b* to remove the first electronic component 4 from the container 2 through the first opening 2*a*3.

The electronic device 1 includes a first lid sealing member 7 formed, for example, of an elastic material that seals the first chamber 6 by the first opening 2*a*3 of the container body 2*a* being closed by the first lid 2*b*. According to this configuration, the sealing property of the first lid 2*b* can be improved.

The first lid 2*b* includes a lid body 2*b*1 made of metal or the like and a transparent window 2*b*2 made of glass or the like. According to this configuration, the inside of the first chamber 6 is visible from the outside while the first chamber 6 is closed.

The first opening 2*a*3 is configured to allow the electrical connection component 3 to pass through the first opening 2*a*3. According to this configuration, the electrical connection component 3 can be removed from the container 2 through the first opening 2*a*3 by opening the first lid 2*b*.

The container body 2*a* forms a second opening 2*a*4 through which the second electronic component 5 can pass at the other side of the partition wall 2*al*, and the container 2 includes a second lid 2*c* capable of opening the second opening 2*a*4. According to this configuration, a closed second chamber 8 can be formed on the other side of the partition wall 2*al* by closing the second opening 2*a*4 of the container body 2*a* with the second lid 2*c*, and the second chamber 8 can be opened by the second lid 2*c* to remove the second electronic component 5 from the container 2 through the second opening 2*a*4.

The electronic device 1 includes a second lid sealing member 9 formed, for example, of an elastic material that seals the second chamber 8 by the second opening 2*a*4 of the container body 2*a* being closed by the second lid 2*c*. According to this configuration, the sealing property of the second lid 2*c* can be improved.

The first electronic component 4 may be configured to be attachable to the container body 2*a* by a fixing member for the first electronic component, such as a screw. According to this configuration, the first electronic component 4 can be fixed to the container body 2*a* by the fixing member for the first electronic component, and the fixation by the fixing member for the first electronic component can be released for detachment of the first electronic component 4 from the container body 2*a* and removal from the container 2.

The electrical connection component 3 may be configured to be attachable to the container body 2*a* by a fixing member for the electrical connection component, such as a screw. According to this configuration, the electrical connection component 3 can be fixed to the container body 2*a* by the fixing member for the electrical connection component, and the fixation by the fixing member for the electrical connection component can be released for detachment of the electrical connection component 3 from the container body 2*a* and removal from the container 2.

The second electronic component 5 may be configured to be attachable to the container body 2*a* by a fixing member for the second electronic component, such as a screw. According to this configuration, the second electronic component 5 can be fixed to the container body 2a by the fixing member for the second electronic component, and the fixation by the fixing member for the second electronic component can be released for detachment of the second electronic component 5 from the container body 2a and removal from the container 2.

One of the first electronic component 4 and the second electronic component 5 may be an amplifier component, and the other of the first electronic component 4 and the second electronic component 5 may be a terminal component. According to this configuration, the amplifier component and the terminal component can be sorted at the time of disposal. The amplifier component transmits an electrical signal to the terminal component, for example. The terminal component transmits electric power to the amplifier component, for example.

The first electronic component 4 includes a substrate 4a and a first connector 4b mounted on the substrate 4a, and the first electronic component 4 is fixed to the partition wall 2al by being attached to the electrical connection component 3 via the first connector 4b. According to this configuration, mounting and electrical connection of the first electronic component 4 to the electrical connection component 3 can be achieved by a simple structure using the first connector 4b mounted on the substrate 4a.

The second electronic component 5 includes a substrate 5a and a second connector 5b mounted on the substrate 5a, and the second electronic component 5 is fixed to the partition wall 2al by being attached to the electrical connection component 3 via the second connector 5b. According to this configuration, mounting and electrical connection of the second electronic component 5 to the electrical connection component 3 can be achieved by a simple structure using the second connector 5b mounted on the substrate 5a.

The electronic device 1 includes a partition wall sealing member 10 that surrounds the insertion portion 3a of the electrical connection component 3 so as to seal the gap between the partition wall 2al and the electrical connection component 3 and that is formed of an elastic material, for example. According to this configuration, the sealing property of the partition wall 2al can be improved.

The container 2 includes the container body 2a forming the first opening 2a3 through which the first electronic component 4 can pass at the one side of the partition wall 2al and the second opening 2a4 through which the second electronic component 5 can pass at the other side of the partition wall 2al, the first lid 2b capable of opening the first opening 2a3, and the second lid 2c capable of opening the second opening 2a4. The container body 2a includes the partition wall 2al, and the container body 2a, the first lid 2b, the second lid 2c, and the electrical connection component 3 form an explosion-proof structure. According to the above configuration, an electronic device 1 that satisfies explosion-proof regulations can be realized.

The electronic device 1 is, for example, a differential pressure/pressure transmitter, a temperature transmitter, an electromagnetic, vortex, Coriolis, or ultrasonic flow meter, or the like. The electrical connection between the first electronic component 4 and the second electronic component 5 of the electronic device 1 via the electrical connection component 3 is a 2-wire system, for example, and achieves analog communication, such as 4-20 mA current output, or digital communication, such as FF or Profi, by a power supply from a commercial power source or the like, for example.

The electronic device 1 may be configured as a field device. According to this configuration, a field device such that the electrical connection component 3, the first electronic component 4, and the second electronic component 5 can be separately removed from the container 2 can be achieved.

Field devices are electronic devices 1 used in a plant. The plant is an industrial plant such as a chemical plant; a plant for managing a well site, such as a gas field or oil field, and the surrounding area; a plant for managing power generation such as hydroelectric power, thermal power, nuclear power, or the like; a plant for managing environmental power generation such as solar power, wind power, or the like; a plant for managing water and sewage, a dam, or the like; or another type of plant.

Field devices are often composed of parts made of different materials such as metals and resins, which can be disassembled, sorted, and recovered for reuse if necessary. Hundreds of thousands to millions of field devices are produced per year in the market overall, and it is assumed that a similar number of field devices are disposed of. Whether field devices can be sorted at the time of disposal is of great importance in terms of impact on the global environment.

The present disclosure is not limited to the above-described embodiments and can be modified in various ways without departing from the scope thereof.

The invention claimed is:

1. An electronic device comprising:
a container;
a partition wall dividing a space within the container;
a through-hole provided in the partition wall;
an electrical connection component attached to the partition wall so as to be removable from the container and having an insertion portion inserted into the through-hole;
a first electronic component attachable to the electrical connection component on one side of the partition wall so as to be removable from the container; and
a second electronic component attachable to the electrical connection component on another side of the partition wall so as to be removable from the container, wherein
the first electronic component and the second electronic component can be electrically connected to each other via the electrical connection component by each being attached to the electrical connection component,
the first electronic component includes a first substrate and a first connector fixedly mounted on the first substrate, and the first electronic component is fixed to the partition wall by the first substrate being fixedly attached to the electrical connection component via the first connector which is detachably and electrically connected to the electrical connection component, and
the second electronic component includes a second substrate and a second connector fixedly mounted on the second substrate, and the second electronic component is fixed to the partition wall by the second substrate being fixedly attached to the electrical connection component via the second connector which is detachably and electrically connected to the electrical connection component.

2. The electronic device according to claim 1, wherein the container includes
a container body forming a first opening through which the first electronic component can pass at the one side of the partition wall, and
a first lid capable of opening the first opening.

3. The electronic device according to claim 2, wherein the first opening is configured to allow the electrical connection component to pass through the first opening.

4. The electronic device according to claim 2, wherein
the container body forms a second opening through which the second electronic component can pass at the other side of the partition wall, and
the container includes a second lid capable of opening the second opening.

5. The electronic device according to claim 1, wherein one of the first electronic component and the second electronic component is an amplifier component and the other of the first electronic component and the second electronic component is a terminal component.

6. The electronic device according to claim 1, further comprising a partition wall sealing member surrounding the insertion portion of the electrical connection component so as to seal a gap between the partition wall and the electrical connection component.

7. The electronic device according to claim 1, wherein
the container includes a container body forming a first opening through which the first electronic component can pass at the one side of the partition wall and a second opening through which the second electronic component can pass at the other side of the partition wall, a first lid capable of opening the first opening, and a second lid capable of opening the second opening,
the container body includes the partition wall, and
the container body, the first lid, the second lid, and the electrical connection component form an explosion-proof structure.

8. The electronic device according to claim 1, wherein the electronic device is configured as a field device.

9. The electronic device according to claim 1, wherein
the first connector is detachably and electrically connected to an end portion of the electrical connection component at the one side of the partition wall, and
the second connector is detachably and electrically connected to an end portion of the electrical connection component at the another side of the partition wall.

10. The electronic device according to claim 7, wherein the partition wall is integrally formed on the container body.

* * * * *